United States Patent
Yu et al.

(10) Patent No.: US 7,913,141 B2
(45) Date of Patent: Mar. 22, 2011

(54) POWER GATING IN INTEGRATED CIRCUITS FOR LEAKAGE REDUCTION

(75) Inventors: Lee-Chung Yu, Taipei (TW); Chung-Hsing Wang, Baoshan Township, Hsinchu County (TW); Yung-Chin Hou, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 356 days.

(21) Appl. No.: 11/505,113

(22) Filed: Aug. 16, 2006

(65) Prior Publication Data
US 2008/0082876 A1    Apr. 3, 2008

(51) Int. Cl.
*G01R 31/3187* (2006.01)
*G01R 31/40* (2006.01)
(52) U.S. Cl. .................................. 714/733; 714/718
(58) Field of Classification Search .................. None
See application file for complete search history.

(56) References Cited

U.S. PATENT DOCUMENTS

| | | | | |
|---|---|---|---|---|
| 5,130,645 A * | 7/1992 | Levy | | 324/158.1 |
| 5,576,999 A * | 11/1996 | Kim et al. | | 365/200 |
| 6,034,555 A * | 3/2000 | Taguchi et al. | | 327/53 |
| 6,087,890 A * | 7/2000 | Kim | | 327/526 |
| 6,119,250 A * | 9/2000 | Nishimura et al. | | 714/718 |
| 6,552,445 B1 * | 4/2003 | Yang | | 307/38 |
| 6,744,274 B1 * | 6/2004 | Arnold et al. | | 326/16 |
| 6,795,355 B2 * | 9/2004 | Ooishi | | 365/201 |
| 6,907,555 B1 * | 6/2005 | Nomura et al. | | 714/719 |
| 6,928,010 B2 * | 8/2005 | Ooishi | | 365/201 |
| 6,931,344 B2 * | 8/2005 | Gotoh et al. | | 702/117 |
| 2002/0008999 A1 * | 1/2002 | Hidaka | | 365/200 |
| 2003/0201457 A1 | 10/2003 | Lin et al. | | 257/173 |

\* cited by examiner

*Primary Examiner* — Robert Beausoliel
*Assistant Examiner* — Dipakkumar Gandhi
(74) *Attorney, Agent, or Firm* — K&L Gates LLP

(57) ABSTRACT

A system is disclosed for reducing current leakages in an integrated circuit (IC), the system comprises one or more separated power supply lines connecting between one or more power sources and an isolated circuitry, one or more switches on the separated power supply lines for controlling the connections between the power sources and the isolated circuitry, and one or more controllers for turning the switches on or off according to one or more predetermined conditions.

6 Claims, 5 Drawing Sheets

POWER GATING IN INTEGRATED CIRCUITS FOR LEAKAGE REDUCTION

BACKGROUND

The present invention relates generally to an integrated circuit (IC) design, and, more particularly, to designs of power supply to built-in test circuitries in ICs.

As semiconductor processing technology has progressed to deep submicron technologies, more and more devices can be packed in a single chip. Each device may have a small amount of leakage, but an accumulative leakage from a great number of devices can pose a problem, especially to a chip used in a hand-held equipment powered by batteries.

Many complicated chips have built-in self test (BIST) circuitries to facilitating the testing of the chips prior to shipping them to customers. These BIST circuitries are used only during the chip testing phase, once a chip passes the test and is shipped to a customer, those BIST circuitries will not be used any more. But devices in the BIST circuitries are still coupled to a power supply, hence still produce leakage, even they have no functions during the chip operations.

A traditional way to reduce leakage from BIST circuitries is to use devices with higher threshold voltage to build the BIST circuitries, as speed requirements for the BIST is normally very lose. High threshold voltage devices have lower leakage, but switching speed is also slower than their lower threshold voltage counterparts. But this method does not completely cut off the leakage, and some time it may require additional processing steps.

So what is desired is a design that can reduce the number of devices, which can contribute to the overall leakage to the minimum.

SUMMARY

In view of the foregoing, the following provides a method and system for reducing current leakages in an integrated circuit (IC).

In one embodiment, the system comprises one or more separated power supply lines connecting between one or more power sources and an isolated circuitry, one or more switches on the separated power supply lines for controlling the connections between the power sources and the isolated circuitry, and one or more controllers for turning the switches on or off according to one or more predetermined conditions.

The construction and method of operation of the invention, however, together with additional objects and advantages thereof will be best understood from the following description of specific embodiments when read in connection with the accompanying drawings.

DESCRIPTION

The present disclosure provides a system and method for supplying power to built-in self test (BIST) circuitries only when the BIST circuitry is in operation.

Figure 1:
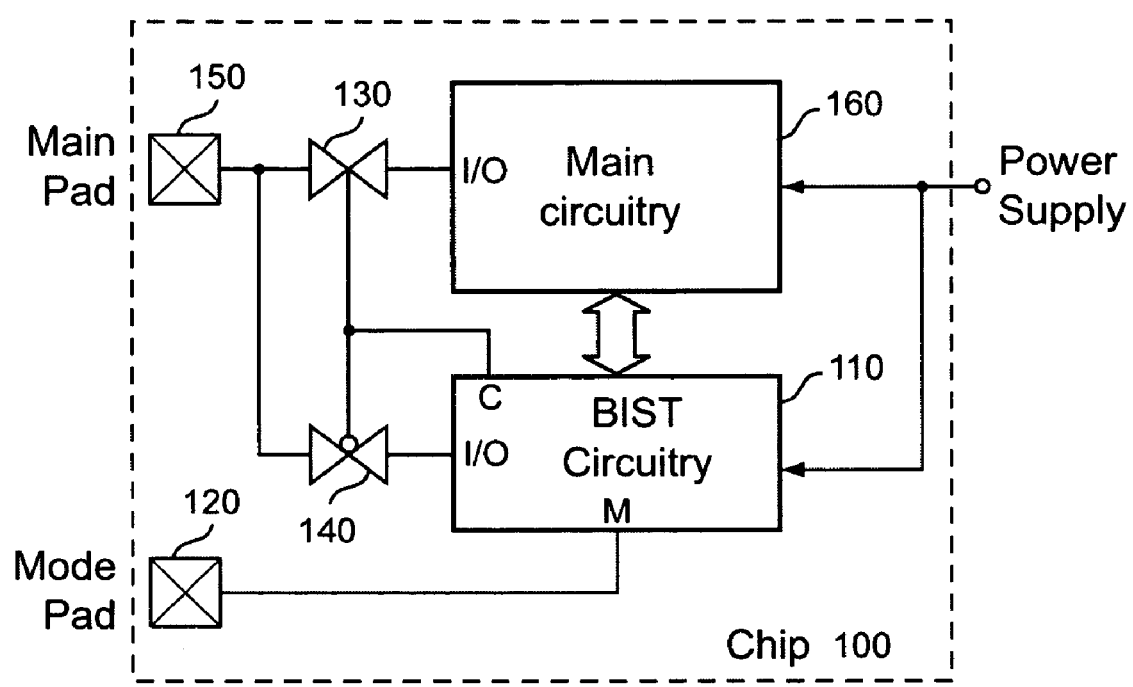
FIG. 1 is a block diagram illustrating a chip with a built-in self test (BIST) circuitry.

FIG. 1 is a block diagram illustrating a chip 100 with a built-in self test (BIST) circuitry 110. A mode pad 120 is used to determine whether the chip 100 is in normal operation or in test mode. Customarily when a logic high voltage is applied to the mode pad 120, the chip 100 goes into test mode. The BIST circuitry 110 sends out a signal from node C to turn off a multiplexer 130 and turn on another multiplexer 140, so that a main pad 150 becomes coupled to the BIST circuitry 110 during a test mode operation. Then the main pad 150 becomes an I/O pad for the BIST circuitry 110, which in turn performs various test functions as designed. Referring to FIG. 1, the singular main pad 150 is only a representative of a plurality of main pads.

Referring to FIG. 1, a main circuitry 160 is the main functional circuitry that chip 100 is all about. The BIST circuitry 110 is so designed to facilitate testing of the main circuitry 160.

Referring to FIG. 1, a power supply is hard wired to both main circuitry 160 and the BIST circuitry 110. Even during normal operation when the BIST circuitry 110 is totally disengaged from the main circuitry 160, the power supply is still provided to the BIST circuitry 110, which will then inevitably produce some leakage current.

Figure 2:
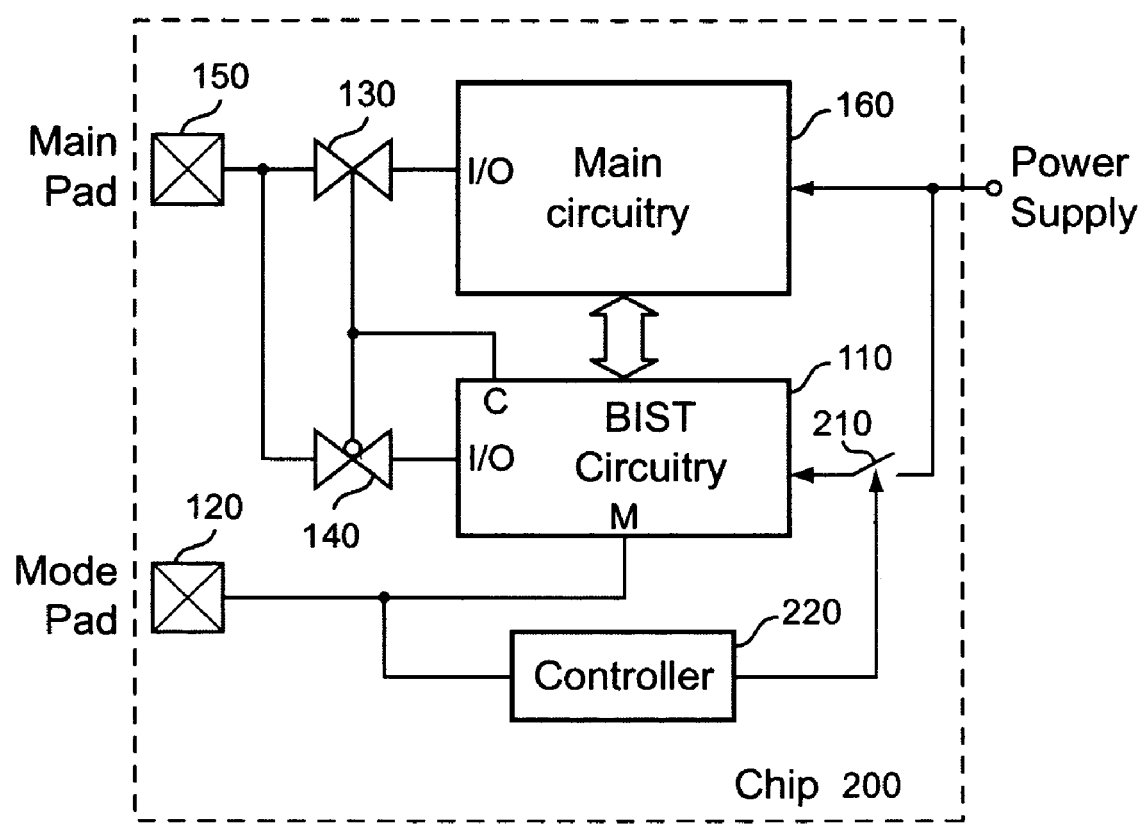
FIG. 2 is a block diagram illustrating a power supply to a BIST circuitry controlled by a switch according to one embodiment of the present invention.

FIG. 2 is a block diagram illustrating a power supply to the BIST circuitry 110 being controlled by a switch 210 according to one embodiment of the present invention. The switch 210 is controlled by a controller 220, which is coupled to the mode pad 120. When mode pad 120 is in logic high state, the BIST circuitry 110 is engaged, and the controller 220 closes the switch 210, so that the power is supplied to the BIST circuitry to allow it to function normally. When mode pad 120 is in logic low state, the BIST circuitry 110 is disengaged, and the controller 220 opens the switch 210, so that the power supply to the BIST circuitry 110 is cut off. Then the BIST circuitry 110 does not contribute any leakage.

The present disclosure uses BIST as an example to illustrate the inventive concept. In fact, any circuitry that can be isolated from the main circuitry, and is disengaged from the main circuitry during normal operation, can employ the present invention. A boundary scan, or JTAG, circuitry is another example of such isolated circuitries.

FIG. 3A~3D are schematic diagrams illustrating implementations of the switch 210 and the switch controller 220 that together control the power supply to the BIST circuitry.

Figure 3A:
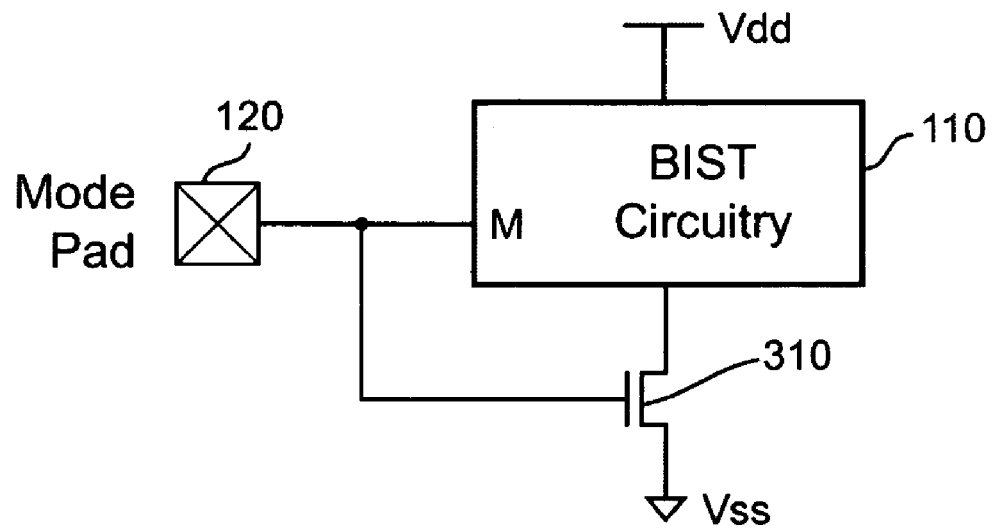
FIG. 3A~3D are schematic diagrams illustrating implementations of the switch and switch controllers that control the power supply to the BIST circuitry according to embodiments of the present invention.

FIG. 3A illustrates that an N-type metal-oxide-semiconductor (NMOS) transistor 310 is used as a power switch for the BIST circuitry 110. A source and a drain of the NMOS transistor 310 is placed between the BIST circuitry 110 and a low supply voltage (Vss), and a gate of the NMOS transistor 310 is coupled to the mode pad 120. When the mode pad 120 is in high logic state, the chip enters test mode, and the NMOS transistor 310 is turned on, so that the power supply to the BIST circuitry 110 can flow from a high supply voltage (Vdd) to the Vss. When the mode pad 120 is in low logic state, the chip enters normal operation, and the NMOS transistor 310 is turned off, so that the power supply to the BIST circuitry 110 is cut off. So the direct connection of the mode pad 120 to the gate of the NMOS transistor 310 serves as a controller for the NMOS transistor 310 switch.

Figure 3B:
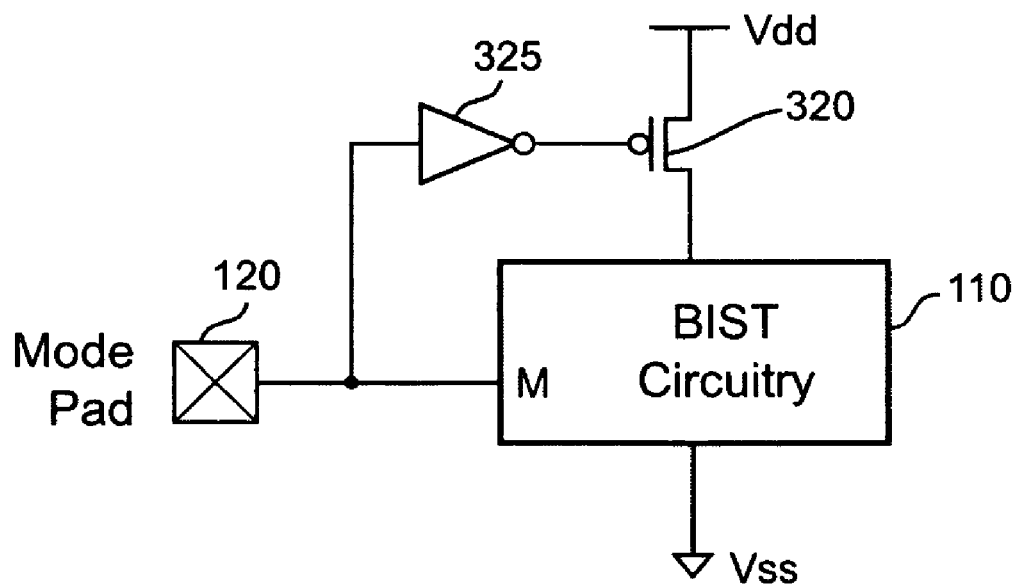

FIG. 3B illustrates that a P-type metal-oxide-semiconductor (NMOS) transistor 320 is used as a power switch for the BIST circuitry 110. A source and a drain of the PMOS transistor 320 is placed between the BIST circuitry 110 and the Vdd, and a gate of the PMOS transistor 320 is coupled to the mode pad 120 through an inverter 325. When the mode pad 120 is in a high logic state, the chip enters test mode, and the PMOS transistor 320 is turned on, so that the power supply to the BIST circuitry 110 can flow from the Vdd to the Vss. When the mode pad 120 is in a low logic state, the chip enters normal operation, and the PMOS transistor 320 is turned off, so that the power supply to the BIST circuitry 110 is cut off. So the connection of the mode pad 120 to the gate of the PMOS transistor 320 through an inverter serves as a controller for the PMOS transistor 320 switch.

In certain applications, once a chip passes the test and is packaged, its BIST circuitry will never be used and can be permanently disabled. Then other kinds of switch control schemes can be used, such as blowing a fuse.

Figure 3C:
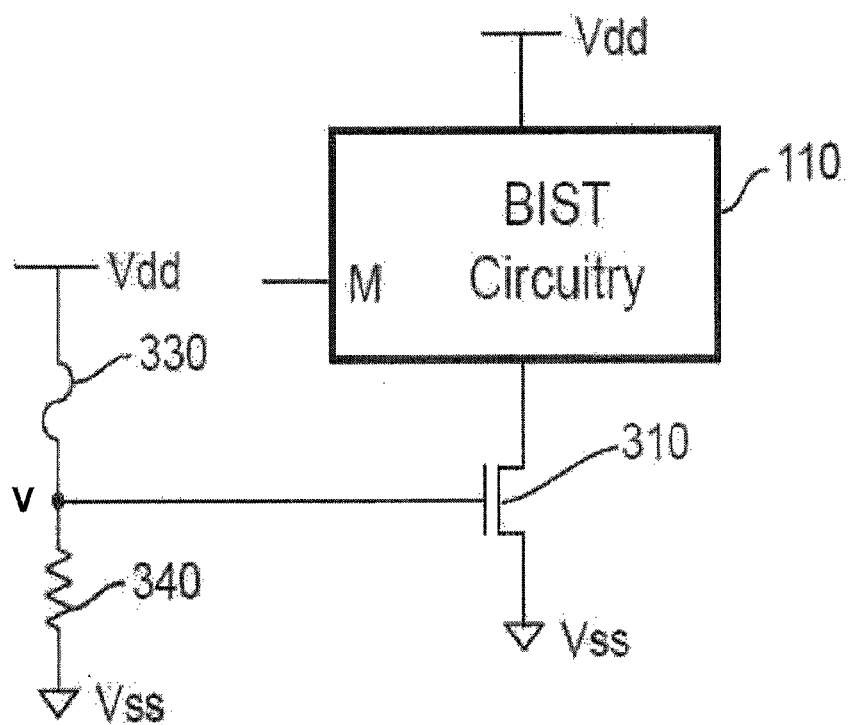

FIG. 3C illustrates a fuse 330 and a resistor 340 connected at node V with the other terminal of the fuse 330 coupled to the Vdd, and the other terminal of the resistor 340 coupled to the Vss. The gate of the switching NMOS 310 is coupled to the node V. The resistance of the fuse 330 is normally less than 100 ohm. While the resistance of the resistor 340 can be set at higher than 20K ohm to limit a current flowing through a path formed by the fuse 330 and the resistor 340. The resistor 340 can be formed by passive semiconductor materials, such as Nwell, or by high-resistance always-on active devices.

Referring to FIG. 3C, before being blown, the fuse 330 provides a low resistance connection between the node V and the Vdd, so that the NMOS 310 is on to provide power supply to the BIST circuitry 110. After the chip is tested, and the BIST circuit 110 is no longer useful, the fuse 330 can be blown, so that the connection between the node V and the Vdd is cut off, and the node V becomes coupled to the Vss which turns off the NMOS transistor 310. Then the power supply to the BIST circuitry 110 is cut off.

Figure 3D:
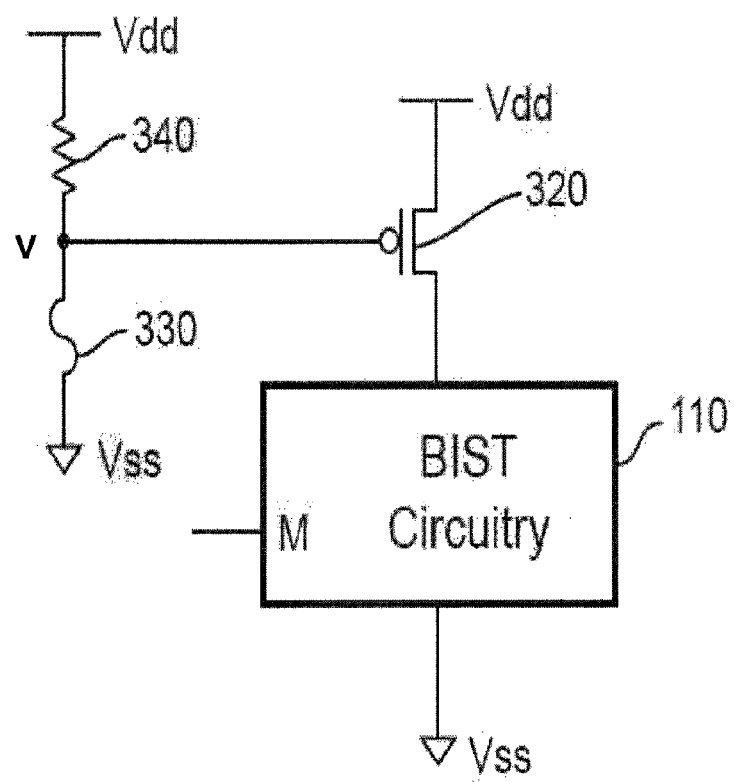

FIG. 3D illustrates the fuse 330 and the resistor 340 connected at node V and with the other terminal of the fuse 330 coupled to the Vss, and the other terminal of the resistor 340 coupled to the Vdd. The gate of the switching PMOS 320 is coupled to the node V. The resistance of the fuse 330 is normally less than 100 ohm. While the resistance of the resistor 340 can be set at higher than 20K ohm to limit a current flowing through a path formed by the fuse 330 and the resistor 340. The resistor 340 can be formed by passive semiconductor materials, such as Nwell, or by high-resistance always-on active devices.

Referring to FIG. 3D, before being blown, the fuse 330 provides a low resistance connection between the node V and the Vss, so that the PMOS 320 is on to provide power supply to the BIST circuitry 110. After the chip is tested, and the BIST circuit 110 is no longer useful, the fuse 330 can be blown, so that the connection between the node V and the Vss is cut off, and the node V becomes coupled to the Vdd, which turns off the PMOS transistor 320. Then the power supply to the BIST circuitry 110 is cut off.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A system for cutting off power supply to a test circuit during a normal operation mode of an integrated circuit (IC) with the test circuit embedded therein, the system comprising:
   a main circuit coupled to the test circuit, the test circuit being designed to test the main circuit;
   a set of main pads coupled to the main circuit and the test circuit via a first multiplexer and a second multiplexer, respectively, wherein the first multiplexer is designed to be turned off during a test mode such that the main pads become electrically connected to the test circuit during the test mode;
   a mode pad coupled to the test circuit for initiating the test mode;
   a power supply coupled to both the main circuit and the test circuit for supplying power thereto at least during the test mode of the IC, the power supply being the only power source to the entire test circuit;
   a switch coupled between the power supply and the test circuit, wherein when the switch is turned off, the test circuit loses power entirely, and when the switch is turned on the test circuit receives power; and
   a controller coupled between the mode pad and the switch and configured to turn the switch on during the test mode and to turn the switch off during the normal operation mode.

2. The system of claim 1, wherein the test circuit is a built-in-self-test (BIST) circuit.

3. The system of claim 1, wherein the test circuit is a boundary-scan circuitry.

4. The system of claim 1, wherein the power supply comprises a low power supply voltage (Vss) and the switch comprises a NMOS transistor with a source coupled to the Vss, a drain coupled to the test circuit and a gate coupled to the controller.

5. The system of claim 1, wherein the power supply comprises a high power supply voltage (Vdd) and the switch comprises a PMOS transistor with a source coupled to the Vdd, a drain coupled to the test circuit and a gate coupled to the controller.

6. The system of claim 1, wherein the controller comprises a fuse and a resistor serially connected between a high power supply voltage (Vdd) and a low power supply voltage (Vss), with a common node of the fuse and the resistor coupled to the switch.

* * * * *